(12) United States Patent
Iguchi

(10) Patent No.: US 10,186,520 B2
(45) Date of Patent: Jan. 22, 2019

(54) SEMICONDUCTOR MEMORY DEVICES INCLUDING A MEMORY CELL ARRAY AND STEPPED WIRING PORTIONS, AND MANUFACTURING METHODS THEREOF

(71) Applicant: Toshiba Memory Corporation, Minato-ku (JP)

(72) Inventor: Tadashi Iguchi, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 23 days.

(21) Appl. No.: 15/255,786

(22) Filed: Sep. 2, 2016

(65) Prior Publication Data
US 2017/0077139 A1 Mar. 16, 2017

Related U.S. Application Data

(60) Provisional application No. 62/217,537, filed on Sep. 11, 2015.

(51) Int. Cl.
*B81B 7/00* (2006.01)
*B81C 1/00* (2006.01)
(Continued)

(52) U.S. Cl.
CPC .... *H01L 27/11582* (2013.01); *H01L 21/4846* (2013.01); *H01L 21/4889* (2013.01); *H01L 27/11575* (2013.01)

(58) Field of Classification Search
CPC ....... H01L 23/50; H01L 23/498; H01L 21/48; H01L 27/115
(Continued)

(56) References Cited

U.S. PATENT DOCUMENTS

| 8,178,861 B2 | 5/2012 | Futatsuyama |
| 8,957,471 B2 | 2/2015 | Fukuzumi |
| (Continued) | | |

FOREIGN PATENT DOCUMENTS

| JP | 2010-98067 | 4/2010 |
| JP | 2012-119476 | 6/2012 |
| JP | 2014-42029 | 3/2014 |

OTHER PUBLICATIONS

U.S. Appl. No. 14/849,743, filed Sep. 10, 2015, Tadashi Iguchi et al.

*Primary Examiner* — Sheng Zhu
(74) *Attorney, Agent, or Firm* — Oblon, McClelland, Maier & Neustadt, L.L.P.

(57) ABSTRACT

A semiconductor memory device according to an embodiment includes a memory cell array that includes memory cells and a plurality of first conducting layers. The memory cells are arrayed in a three-dimensional manner. The first conducting layers are connected to the memory cells and are arrayed in a laminating direction. Stepped wiring portion includes a plurality of second conducting layers. The plurality of second conducting layers connect the first conducting layers and external circuits. At least one of the plurality of second conducting layers includes a contact formation area on a top surface thereof in the stepped wiring portion positioned on the first side portion side. Other ones of the plurality of second conducting layers includes a contact formation area on a top surface thereof in the stepped wiring portion positioned on the second side portion side.

12 Claims, 15 Drawing Sheets

(51) Int. Cl.
*H01L 27/11582* (2017.01)
*H01L 21/48* (2006.01)
*H01L 27/11575* (2017.01)

(58) Field of Classification Search
USPC ........ 257/773, 298, 324, 724; 438/703, 591, 438/666
See application file for complete search history.

(56) References Cited

U.S. PATENT DOCUMENTS

| | | |
|---|---|---|
| 9,230,904 B2 | 1/2016 | Eun et al. |
| 2008/0173932 A1* | 7/2008 | Kidoh ............... H01L 27/11568 257/324 |
| 2009/0230449 A1* | 9/2009 | Sakaguchi .......... H01L 27/0688 257/298 |
| 2012/0187471 A1* | 7/2012 | Yu ..................... H01L 27/11565 257/324 |
| 2014/0054787 A1* | 2/2014 | Eun ..................... H01L 23/498 257/773 |
| 2016/0148946 A1* | 5/2016 | Hironaga .......... H01L 27/11556 257/324 |

* cited by examiner

ENLARGEMENT OF PART A

SEMICONDUCTOR MEMORY DEVICES INCLUDING A MEMORY CELL ARRAY AND STEPPED WIRING PORTIONS, AND MANUFACTURING METHODS THEREOF

This application is based on and claims the benefit of priority from prior U.S. prior provisional Patent Application No. 62/217,537, filed on Sep. 11, 2015, the entire contents of which are incorporated herein by reference.

BACKGROUND

Field

Embodiments described herein relate generally to a semiconductor memory device and a manufacturing method thereof.

Description of the Related Art

As one of a semiconductor memory device, there has been provided a flash memory. In particular, since its inexpensiveness and large capacity, a NAND flash memory has been generally widely used. Up to the present, many techniques to further increase the capacity of this NAND flash memory have been proposed. One of the techniques is a structure of three-dimensionally disposing memory cells. In such three-dimensional semiconductor memory device, the memory cells are disposed in a laminating direction. Conducting layers extend from the respective memory cells, which are disposed in the laminating direction. Such conducting layers extend in a horizontal direction with respect to a substrate and are laminated in the vertical direction with respect to the substrate.

With such three-dimensional semiconductor memory device, an increase in the numbers of laminated layers of the memories and the conducting layers increases an area of a contact area (a stepped portion), which is to extract the conducting layer to the outside.

DETAILED DESCRIPTION

A semiconductor memory device according to an embodiment includes a memory cell array and stepped wiring portions. The stepped wiring portions are disposed on a first side portion of the memory cell array and a second side portion different from the first side portion. The memory cell array includes memory cells and a plurality of first conducting layers. The memory cells are arrayed in a three-dimensional manner. The first conducting layers are connected to the memory cells and are arrayed in a laminating direction. The stepped wiring portion includes a plurality of second conducting layers. The plurality of second conducting layers connect the first conducting layers and external circuits. At least one of the plurality of second conducting layers includes a contact formation area on a top surface thereof in the stepped wiring portion positioned on the first side portion side. Other ones of the plurality of second conducting layers includes a contact formation area on a top surface thereof in the stepped wiring portion positioned on the second side portion side.

The following describes semiconductor memory devices according to embodiments with reference to the accompanying drawings. Here, these embodiments are only examples. For example, the nonvolatile semiconductor memory device described below has a structure where a memory string extends in a straight line in the vertical direction with respect to a substrate. The similar structure is also applicable to the structure having a U shape where a memory string is folded back to the opposite side in the middle. The respective drawings of the nonvolatile semiconductor memory devices used in the following embodiments are schematically illustrated. The thickness, the width, the ratio, and a similar parameter of the layer are not necessarily identical to actual parameters.

The following embodiments relate to a nonvolatile semiconductor memory device in a structure where a plurality of metal-oxide-nitride-oxide-semiconductor (MONOS) type memory cells (transistors) is disposed in a height direction. The MONOS type memory cell includes: a semiconductor film disposed in a columnar shape vertical to the substrate as a channel and a gate electrode film disposed on the side surface of the semiconductor film via an electric charge accumulating layer. However, a similar structure is applicable to another type, for example, a semiconductor-oxide-nitride-oxide-semiconductor (SONOS) type memory cell, a metal-aluminum oxide-nitride-oxide-semiconductor (MANOS) type memory cell, a memory cell that uses hafnium oxide ($HfO_x$) or tantalum oxide ($TaO_x$) as an insulating layer, or a floating-gate type memory cell.

The following embodiments describe the three-dimensional NAND flash memory as an example. However, the structures of the following embodiments are also applicable to other three-dimensional semiconductor memory devices, such as a resistance change memory and a magnetic resistance memory.

[First Embodiment]

Figure 1:
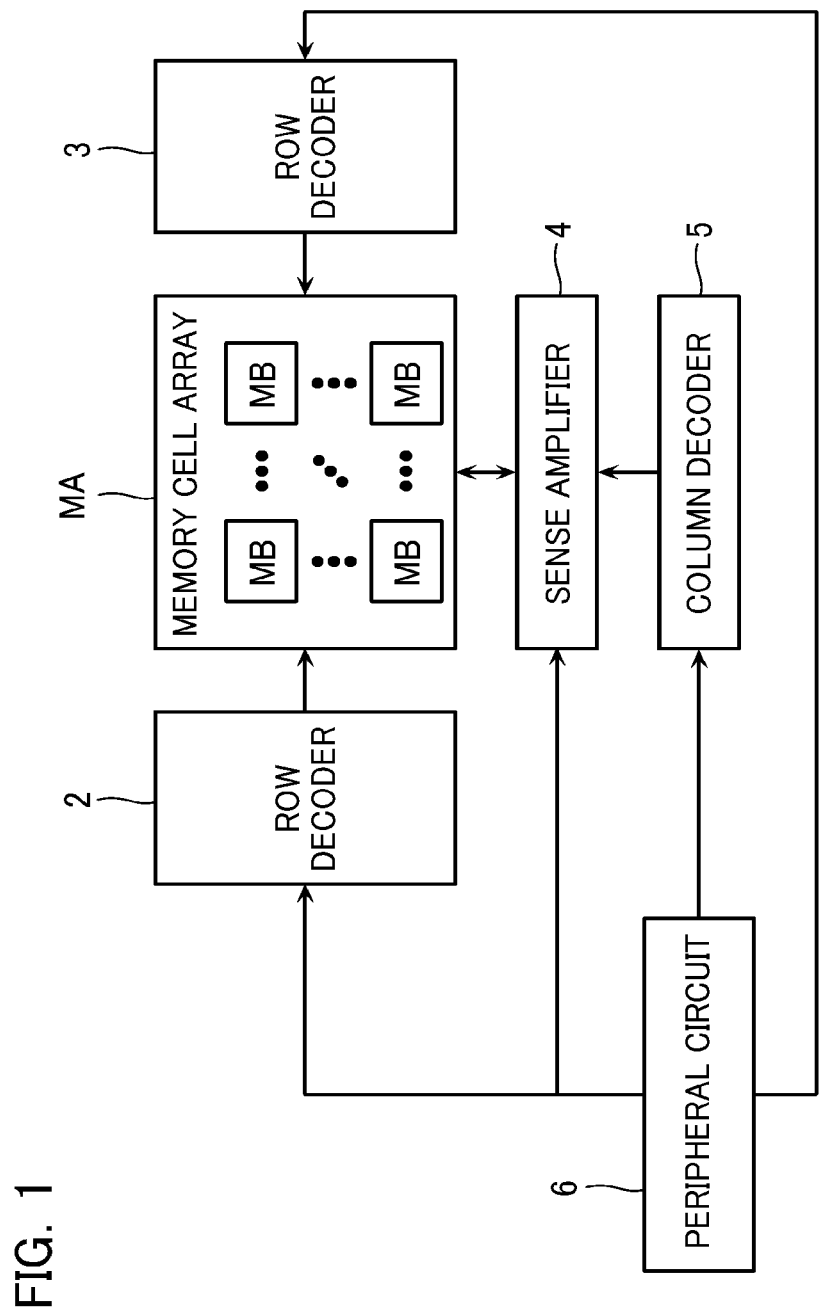
FIG. 1 is a block diagram of a semiconductor memory device according to a first embodiment.

First, the following describes semiconductor memory devices according to the first embodiment in detail with reference to the accompanying drawings. FIG. 1 is a block diagram describing an overall structure of a semiconductor memory device according to the first embodiment.

As illustrated in FIG. 1, the NAND flash memory of this first embodiment includes a memory cell array MA. This NAND flash memory includes a row decoder 2, a row decoder 3, a sense amplifier circuit 4, a column decoder 5, and a peripheral circuit 6 at the peripheral area of the memory cell array MA.

As described later, the memory cell array MA is formed by arraying the memory cells in a three-dimensional manner. This memory cell array MA includes a plurality of word lines WL, a plurality of bit lines BL, and a source line SL. The plurality of word lines WL extend with the longitudinal direction in the X direction in FIG. 1. The plurality of bit lines BL and the source line SL extend with the longitudinal direction in the Y direction. The plurality of word lines WL are laminated in a laminating direction (the Z direction) on the memory cell array MA. The plurality of respective word lines WL are connected to different memory cells MC. The memory cells MC are arrayed in the laminating direction in the memory cell array MA.

The row decoders 2 and 3 are disposed on both sides of the memory cell array MA in the X direction. The row decoders 2 and 3 select the plurality of word lines WL to supply a voltage required for operation. Furthermore, in the Y direction of a stepped wiring portion CR, the sense amplifier circuit 4 and the column decoder 5 are disposed. The sense amplifier circuit 4 has the following functions. The sense amplifier circuit 4 is connected to the bit lines BL via a bit line connection circuit (not illustrated) to supply a voltage for writing to the bit line BL. The sense amplifier circuit 4 detects and amplifies an electric potential appeared on the bit line BL during reading. The column decoder 5 decodes column address signals provided from a control unit (not illustrated) to control the sense amplifier circuit 4. The peripheral circuit 6 includes circuits other than the above-described circuits, for example, a power supply circuit, a charge pump circuit (a step-up circuit), and a data register.

Figure 2:
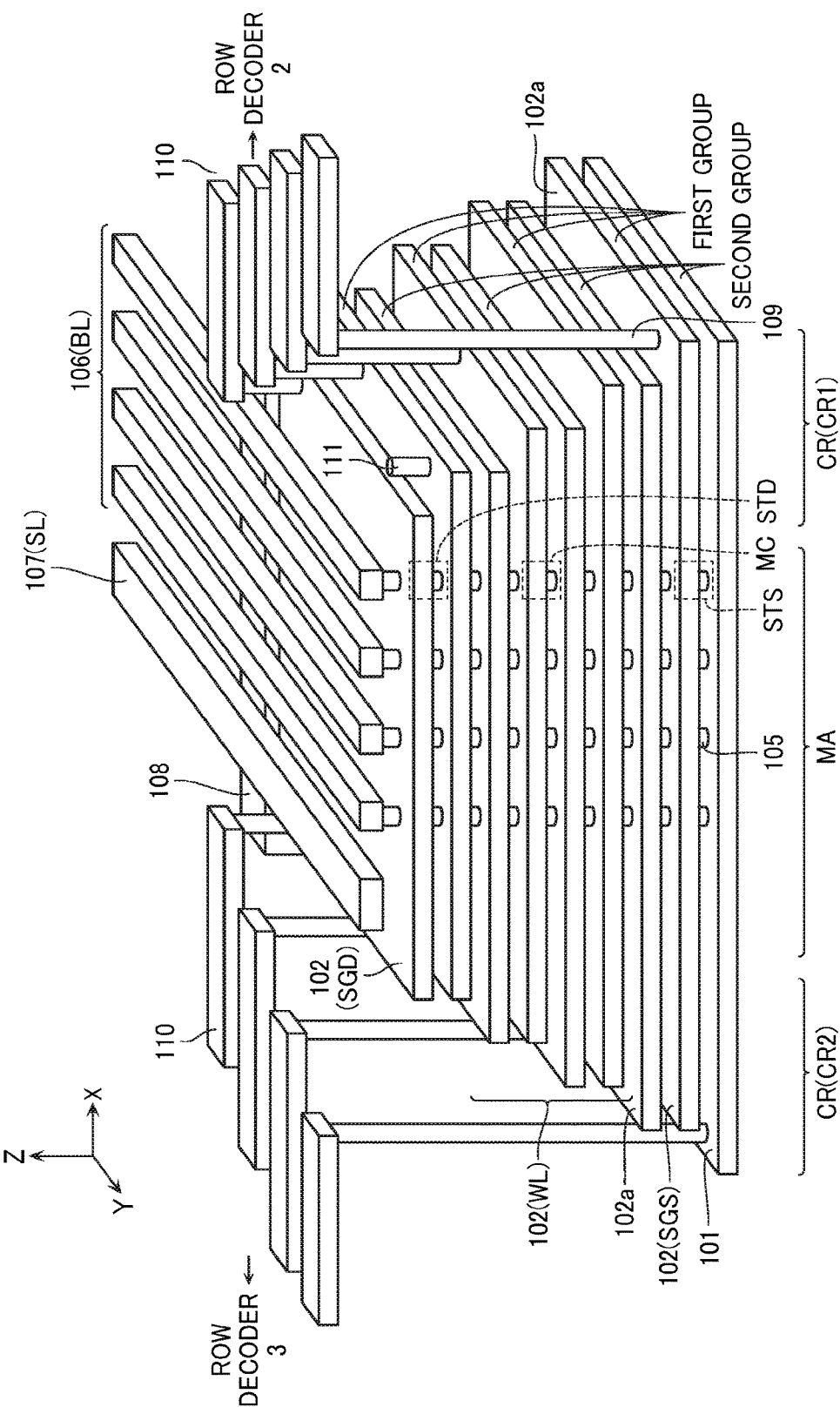
FIG. 2 is a schematic perspective view illustrating a structure of apart of a memory cell array in the semiconductor memory device according to the first embodiment.

Next, the following describes the schematic structure of the memory cell array MA according to the embodiment with reference to FIG. 2. FIG. 2 is a schematic perspective view illustrating the structure of a part of the memory cell array MA. FIG. 2 omits illustrations of a part of structures for simplifying the description. For simplifying the illustration, the numbers of respective wirings also differ from those of other drawings.

As illustrated in FIG. 2, the memory cell array MA according to the first embodiment includes a substrate 101 and a plurality of conducting layers 102. The conducting layers 102 are laminated on the substrate 101 in the Z direction. The memory cell array MA has a plurality of memory columnar bodies 105 extending in the Z direction. As illustrated in FIG. 2, the intersection portions of the conducting layers 102 and the memory columnar bodies 105 function as a source side selection gate transistor STS, the memory cell MC, or a drain side selection gate transistor STD.

The conducting layer 102 is a conducting layer made of, for example, tungsten (W). The conducting layer 102 functions as the word line WL, a source side selection gate line SGS, and a drain side selection gate line SGD. An interlayer insulating film is formed between the conducting layers 102; however, for simplification, FIG. 2 omits the illustration.

At the peripheral area of this memory cell array MA, the stepped wiring portion CR is formed. The stepped wiring portion CR is to connect the word line WL and an external circuit. This stepped wiring portion CR includes extraction wirings (second wirings). The extraction wirings are connected to the conducting layers 102 which serve as the word lines WL, the source side selection gate lines SGS and the drain side selection gate lines SGD, respectively, at the identical layers. These extraction wirings are formed into a stepped pattern on the end portion thereof. The extraction wiring has a role of electrically connecting the conducting layers 102 which serve as the word lines WL, the source side selection gate lines SGS and the drain side selection gate lines SGD, to the external circuit. By the method described later, while a slimming process is isotropically performed on a resist, the laminated conducting layers 102 and interlayer insulating films are etched. Thus, the stepped wiring portion CR is formed.

This stepped wiring portion CR is at least formed on both side portions of the memory cell array MA in the X direction (a first side portion and a second side portion). Hereinafter, the stepped wiring portion CR on the right side portion of the memory cell array MA in FIG. 2 is referred to as a stepped wiring portion CR1, and the stepped wiring portion CR on the left side portion is referred to as a stepped wiring portion CR2. The stepped wiring portion CR1 connects the word lines WL and the row decoder 2. The stepped wiring portion CR2 connects the word lines WL and the row decoder 3.

The conducting layer 102 in the stepped wiring portion CR includes a contact formation area 102a. The contact formation area 102a is not covered with the conducting layer 102 positioned on the upper layer and is exposed. That is, the conducting layers 102 are disposed such that the end portions in the X direction differ. The conducting layers 102 form the stepped pattern, which include the contact formation areas 102a, on the different positions on the end portions (as described later, the conducting layers 102 whose end portions match are also present). On the top surface of the contact formation areas 102a, contact plugs 109 are formed. Further, wirings 110 are disposed at the upper ends of the contact plugs 109. The contact plug 109 and the wiring 110 are made of the conducting layer such as tungsten.

Then, the stepped wiring portions CR1 and CR2 include the contact formation areas 102a on the respective different positions (heights). To describe specifically, in the stepped wiring portion CR1, some of the plurality of conducting layers 102 (a first group) include the contact formation areas 102a on their top surfaces. However, the conducting layers 102 other than these conducting layers 102 are covered with the other conducting layers 102 on their upper layer sides, not including a contact formation area. Meanwhile, in the stepped wiring portion CR2, the contact formation areas 102a are provided on the conducting layers 102 (a second group) where the contact formation areas 102a are not formed in the stepped wiring portion CR1. That is, in the stepped wiring portion CR2, the conducting layers 102 in the second group include the contact formation areas 102a on the top surfaces. The top surfaces of the conducting layers 102 in the first group principally have an aspect of covered with the conducting layers 102 positioned on the upper layer sides. In the example illustrated in FIG. 2, in the stepped wiring portion CR1, the contact formation areas 102a are disposed on the even-th word lines WL counted from the upper layer. Meanwhile, the contact formation areas 102a are not disposed on the odd-th word lines WL counted from the upper layer. Inversely, in the stepped wiring portion CR2, the contact formation areas 102a are disposed on the odd-th word lines WL counted from the upper layer. Meanwhile, the contact formation areas 102a are not disposed on the even-th word lines WL counted from the upper layer.

Although the stepped wiring portions CR can be disposed not only on the side portions of the memory cell array MA in the X direction but also on the side portions of the memory cell array MA in the Y direction, FIG. 2 omits the illustration. It is also possible to omit a stepped wiring portion in the Y direction.

As illustrated in FIG. 2, the memory cell array MA according to the first embodiment includes a support pillar 111. The support pillar 111 is disposed so as to have a longitudinal direction in a laminating direction of a laminated body formed of the plurality of conducting layers 102 and the interlayer insulating films between the conducting layers 102. This support pillar 111 is formed to maintain the posture of the laminated body during the manufacturing process for this laminated body. The conducting layers 102 can be formed by the following processes as described later. The interlayer insulating films and sacrificial layers are laminated. Then, the sacrificial layers are removed by wet etching or a similar method. Afterward, the conductive films, which are made of a material such as tungsten, are embedded into voids formed by removing the sacrificial layers. When performing such processes, to prevent the interlayer insulating film from collapsing, the above-described support pillar 111 is disposed. FIG. 2 representatively illustrates only the one support pillar 111. However, the actual device can include more of the support pillars 111.

As illustrated in FIG. 2, the memory cell array MA according to the first embodiment includes a conducting layer 108. The conducting layer 108 is opposed to the side surfaces of the plurality of conducting layers 102 in the Y direction and extends in the X direction. The lower surface of the conducting layer 108 is in contact with the substrate 101. The conducting layer 108 is a conducting layer made of, for example, tungsten (W). The conducting layer 108 functions as a source contact LI.

The material of the conducting layer 102, as well as the above-described tungsten (W), is possibly constituted of a conducting layer such as WN, Al, Ti, V, Cr, Mn, Fe, Co, Ni, Cu, TiN, $WSi_x$, $TaSi_x$, $PdSi_x$, $ErSi_x$, $YSi_x$, $PtSi_x$, $HfSi_x$, $NiSi_x$, $CoSi_x$, $TiSi_x$, $VSi_x$, $CrSi_x$, $MnSi_x$, and $FeSi_x$.

As illustrated in FIG. 2, the memory cell array MA according to the first embodiment includes a plurality of conducting layers 106 and a conducting layer 107. The plurality of conducting layers 106 and the conducting layer 107 are disposed above the plurality of conducting layers 102 and memory columnar bodies 105. The plurality of conducting layers 106 are disposed in the X direction. The plurality of conducting layers 106 and the conducting layer 107 extend in the Y direction. The memory columnar bodies 105 are each connected to the lower surfaces of the conducting layers 106. The conducting layer 106 is, for example, constituted of the conducting layer such as tungsten (W) and functions as a bit line BL. The conducting layer 108 is connected to the lower surfaces of the conducting layers 107. The conducting layer 107 is, for example, constituted of the conducting layer such as tungsten (W) and functions as the source line SL. The top surface of the conducting layer 108 is connected to the conducting layer 107 (the source line SL). Meanwhile, as described later, the lower surface of the conducting layer 108 is connected to the semiconductor substrate. Thus, the conducting layer 108 functions as the source contact LI to electrically connect the source line SL and the memory columnar body 105.

Figure 3:
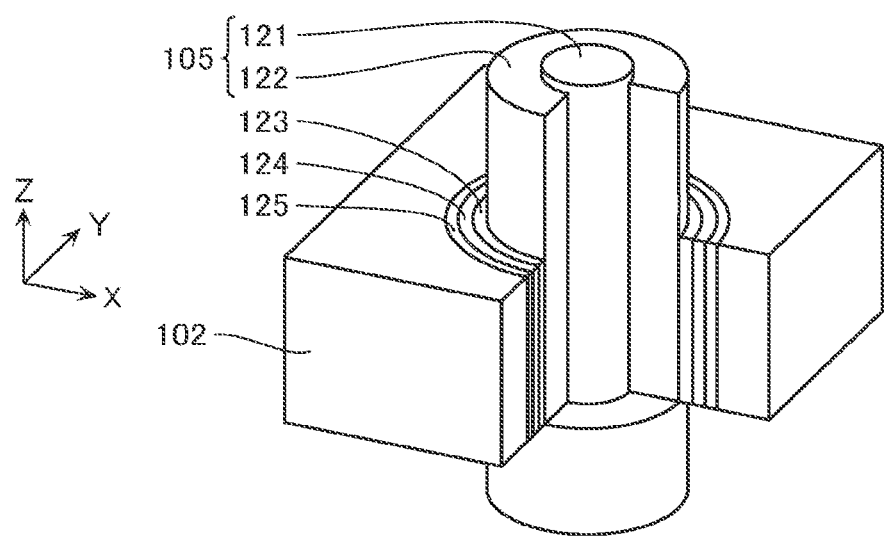
FIG. 3 is a schematic diagram illustrating a schematic structure of a memory cell MC in the semiconductor memory device according to the first embodiment.

Next, with reference to FIG. 3, the following describes the schematic structure of the memory cell MC according to the first embodiment. FIG. 3 is a schematic perspective view illustrating the structure of the memory cell MC. FIG. 3 illustrates the structure of the memory cell MC. Note that the source side selection transistor STS and the drain side selection gate transistor STD may also be configured similar to the memory cell MC. FIG. 3 omits a part of the structure.

As illustrated in FIG. 3, the memory cell MC is disposed at a portion where the conducting layer 102 intersects with the memory columnar body 105. The memory columnar body 105 includes a core insulating layer 121 and a columnar semiconductor layer 122. The semiconductor layer 122 covers the sidewall of the core insulating layer 121. Moreover, between the semiconductor layer 122 and the conducting layer 102, a memory gate insulating film is disposed. The memory gate insulating film includes a tunnel insulating layer 123, an electric charge accumulating layer 124, and a block insulating layer 125. The core insulating layer 121 is constituted of, for example, an insulating layer such as silicon oxide ($SiO_2$). The semiconductor layer 122 is constituted of, for example, a semiconductor layer such as polysilicon. The semiconductor layer 122 functions as a channel for the memory cell MC, the source side selection transistor STS, and the drain side selection gate transistor STD. The tunnel insulating layer 123 is constituted of, for example, an insulating layer such as silicon oxide ($SiO_2$). The electric charge accumulating layer 124 is constituted of, for example, an insulating layer such as silicon nitride (SiN) that can accumulate electric charges. The block insulating layer 125 is constituted of, for example, an insulating layer such as silicon oxide ($SiO_2$).

The material of the semiconductor layer 122, as well as the above-described polysilicon, is possibly constituted of a semiconductor such as SiGe, SiC, Ge, and C. On surfaces at which the semiconductor layer 122 is in contact with the substrate 101 and the conducting layers 106, silicide may be formed. As such silicide, for example, Sc, Ti, VCr, Mn, Fe, Co, Ni, Cu, Zn, Rh, Pd, Ag, Cd, In, Sn, La, Hf, Ta, W, Re, Os, Ir, Pt, and Au are possibly used. Additionally, Sc, Ti, VCr, Mn, Fe, Co, Ni, Cu, Y, Zr, Nb, Mo, Tc, Ru, Rh, Pd, Ag, Cd, In, Sn, La, Hf, Ta, W, Re, Os, Ir, Pt, Au, or a similar material may be added to the silicide thus formed.

The tunnel insulating layer 123 and the block insulating layer 125 are possibly consisted of a material, for example, oxide and oxynitride, in addition to the above-described silicon oxide ($SiO_2$). The oxide constituting the tunnel insulating layer 123 and the block insulating layer 125 is possibly $SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, or a similar material. The oxide constituting the tunnel insulating layer 123 and the block insulating layer 125 may also be $AB_2O_4$. Note that A and B described here are identical or different elements and one of elements among Al, Sc, Ti, V, Cr, Mn, Fe, Co, Ni, Cu, Zn, Ga, and Ge. For example, $AB_2O_4$ is $Fe_3O_4$, $FeAl_2O_4$, $Mn_{1+x}Al_{2-x}O_{4+y}$, $Co_{1+x}Al_{2-x}O_{4+y}$, or $MnO_x$.

The oxide constituting the tunnel insulating layer 123 and the block insulating layer 125 may also be $ABO_3$. Note that A and B described here are identical or different elements and one of elements among Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn. For example, $ABO_3$ is, $LaAlO_3$, $SrHfO_3$, $SrZrO_3$, or $SrTiO_3$.

The oxynitride constituting the tunnel insulating layer 123 and the block insulating layer 125 is possibly, for example, SiON, AlON, YON, LaON, GdON, CeON, TaON, Hf ON, ZrON, TiON, LaAlON, SrHfON, SrZrON, SrTiON, HfSiON, HfAlON, ZrSiON, ZrAlON, and AlSiON.

The oxynitride constituting the tunnel insulating layer 123 and the block insulating layer 125 may be a material constituted by replacing some of oxygen elements of the respective materials described above as an oxide constituting the tunnel insulating layer 123 and the block insulating layer 125 with a nitrogen element.

As the material for the tunnel insulating layer 123 and the block insulating layer 125, $SiO_2$, SiN, $Si_3N_4$, $Al_2O_3$, SiON, $HfO_2$, HfSiON, $Ta_2O_5$, $TiO_2$, or $SrTiO_3$ is preferable.

In particular, an Si-based insulating film such as $SiO_2$, SiN, and SiON includes an insulating film whose respective concentrations of the oxygen element and the nitrogen element are $1 \times 10^{18}$ atoms/cm$^3$ or more. Note that a barrier height of the plurality of insulating layers differ from one another.

The tunnel insulating layer 123 and the block insulating layer 125 may contain impurity atoms forming defective levels or semiconductor/metal dot (a quantum dot).

Figure 4:
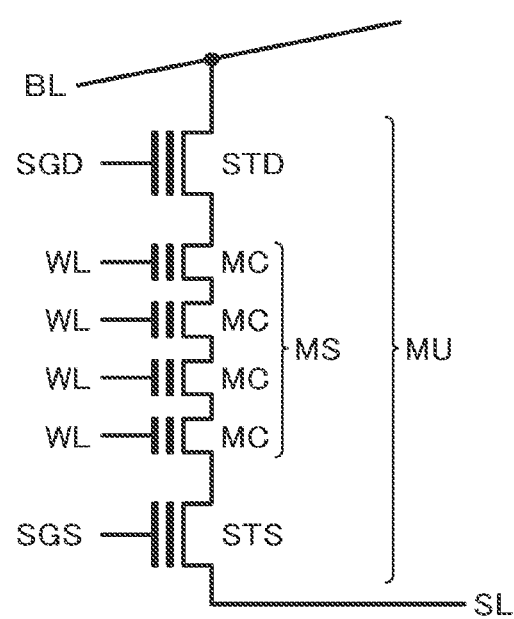
FIG. 4 is an equivalent circuit diagram of a memory unit MU in the semiconductor memory device according to the first embodiment.

The connection of the memory cell MC and the selection transistors STD and STS with the above-described structure in series configures the memory unit MU as illustrated in FIG. 4. That is, the memory unit MU includes a memory string MS, the source side selection transistor STS, and the drain selection transistor STD. The memory string MS is formed of the plurality of memory cells MC connected in series. The source side selection transistor STS and the drain side selection gate transistor STD are connected to both ends of the memory string MS. Some of the plurality of memory cells MC in the memory string MS can be dummy cells not used for data storage. The number of dummy cells can be set to any given number.

Figure 5:
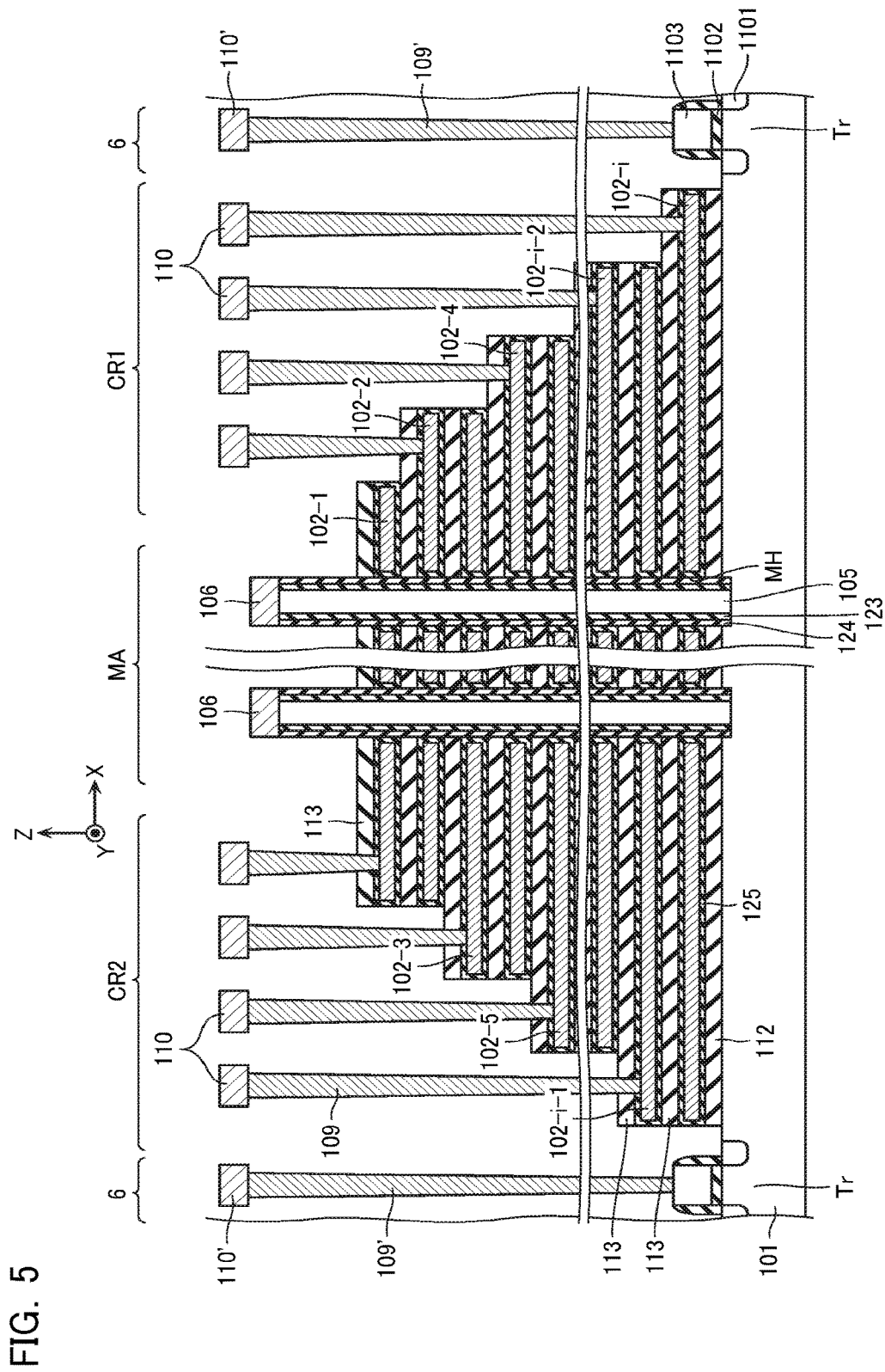
FIG. 5 is a cross-sectional view of the semiconductor memory device according to the first embodiment along the X direction.

Next, with reference to FIG. 5, the following describes details of the structure of the memory cell array MA and the stepped wiring portion CR in the semiconductor memory device according to the first embodiment. FIG. 5 is a cross-sectional view of the memory cell array MA and the stepped wiring portion CR along the X-Z plane in FIG. 2. FIG. 5 also illustrates the cross-sectional view of the peripheral circuit 6. FIG. 5 differs in the numbers of the word lines WL and the selection gate lines SGD and SGS from those of the schematic diagram in FIG. 2.

As illustrated in FIG. 5, in the memory cell array MA, a plurality (i pieces) of the conducting layers 102 (102_1 to 102_i) are laminated on the substrate 101 sandwiching the interlayer insulating films 112 and 113.

A large number of memory holes MH are formed in the memory cell array MA so as to penetrate the laminated body of these conducting layers 102 and interlayer insulating films 112 and 113. In this memory hole MH, the above-described memory columnar body 105 is formed via the tunnel insulating layer 123 and the electric charge accumulating layer 124. That is, the memory columnar body 105 is formed such that the peripheral area of the memory columnar body 105 is surrounded by the laminated body of the conducting layer 102 and the interlayer insulating films 112 and 113. In the example illustrated in FIG. 5, the block insulating layers 125 are, as illustrated in FIG. 5, formed not the inside of the memory holes MH but so as to cover the peripheral areas of the conducting layers 102_1 to 102_i. However, it is also possible to form the block insulating layer 125 inside the memory hole MH, as well as the tunnel insulating layer 123 and the electric charge accumulating layer 124. To the upper end of the memory columnar body 105, the conducting layer 106, which functions as the bit line BL, is connected. The conducting layer 106 extends with the longitudinal direction in the Y direction.

In the peripheral circuit 6, transistors Tr, which constitute the peripheral circuits, are formed on the semiconductor substrate 101. As illustrated in FIG. 5, the transistor Tr includes a source/drain diffusion area 1101 and a gate electrode 1103. The source/drain diffusion area 1101 is formed on the surface of the semiconductor substrate 101. The gate electrode 1103 is formed on the surface of the semiconductor substrate 101 between the source/drain diffusion areas 1101 via a gate insulating film 1102. A contact plug 109P is connected to the surface of to this gate electrode 1103. A metal wiring 110' is connected to the upper end of the contact plug 109P.

The contact plugs 109 (109_1 to 109_i) are connected to the contact formation areas 102a of the respective conducting layers 102 constituting the stepped wiring portion CR. The upper ends of the contact plug 109 are connected to upper layer wirings 110. Through such upper layer wirings 110 and wiring layers (not illustrated), the contact plugs 109 are connected to the external circuits.

As illustrated in FIG. 5, with the first embodiment, the conducting layers 102_i, which is on the lowermost layer, functions as the source side selection gate line SGS and the control gate electrodes of the source side selection gate transistor STS. The conducting layers 102_2 to 102_i-1 function as the word lines WL and the control gate electrodes of the memory cells MC. That is, the one memory string MS includes (i-2) pieces of the memory cells MC. The (i-2) pieces of the word lines WL are connected to the memory cells MC. The conducting layers 102_1, which is on the uppermost layer, functions as the drain side selection gate line SGD and the control gate electrodes of the drain side selection gate transistor STD.

The numbers of the source side selection gate lines SGS and the drain side selection gate lines SGD, which are formed on the one memory unit MU (the memory columnar body 105), are not limited to one piece as illustrated in the drawing. The plurality of the source side selection gate lines SGS and the drain side selection gate lines SGD are also possible.

As described above, the stepped wiring portion CR includes the stepped wiring portion CR1 and the stepped wiring portion CR2. The stepped wiring portion CR1 is disposed on the right end portion of the memory cell array MA in the X direction. The stepped wiring portion CR2 is disposed on the left end portion. In the stepped wiring portion CR1, the contact formation areas 102a are disposed on the even-th conducting layers 102 (102_2, 102_4, . . . 102_i-2, and 102_i) counted from the above. In the stepped wiring portion CR2, the contact formation areas 102a are disposed on the odd-th conducting layers 102 (102_1, 102_3, . . . 102_i-3, and 102_i-1) counted from the above.

However, on a certain conducting layer 102_k (k=1 to i), the contact formation area 102a is formed only one of the stepped wiring portions CR1 and CR2. For example, in the example of FIG. 5, the contact formation areas 102a are formed on the odd-th conducting layers 102_1, 102_3 . . . , and 102_i-1 counted from the upper layer in the stepped wiring portion CR2, but the contact formation areas 102a are not formed in the stepped wiring portion CR1. Meanwhile, in the stepped wiring portion CR1, the contact formation areas 102a are formed on the even-th conducting layers 102_2, 102_4, . . . and 102_i counted from the upper layer; however, the contact formation areas 102a are not formed on the even-th conducting layers 102_2, 102_4, . . . and 102_i in the stepped wiring portion CR2. Thus, the contact formation areas 102a are disposed alternately on either of the right and left stepped wiring portions CR1 and CR2.

In the stepped wiring portion CR1, the contact formation areas 102a are not disposed on the top surfaces of the odd-th conducting layers 102 counted from the upper layer. Instead, the top surfaces are covered with the other conducting layers 102. The conducting layer 102 that does not include the contact formation area 102a can align the end portion in the X direction with the conducting layer 102 on the upper layer. However, all the top surfaces of the conducting layers 102 where the contact plugs 109 are not formed need not to be covered with the other conducting layers 102 on their upper layers. That is, it is only necessary that at least some of the conducting layers 102 where the contact formation areas 102a are not disposed are covered with the other conducting layers 102 on their upper layers.

Similarly, in the stepped wiring portion CR2, the contact formation areas 102a are not disposed on the top surfaces of the even-th conducting layers 102 counted from the upper layer. Instead, the top surfaces are covered with the other conducting layers 102. The conducting layer 102 that does not include the contact formation area 102a can align the end portion in the X direction with the conducting layer 102 on the upper layer. However, all the top surfaces of the conducting layers 102 where the contact plugs 109 are not formed need not to be covered with the other conducting layers 102 on their upper layers. That is, it is only necessary that at least some of the conducting layers 102 where the contact formation areas 102a are not disposed be covered with the other conducting layers 102 on their upper layers.

The above-described structure allows the stepped wiring portions CR1 and CR2 to be less number of steps compared with the number of laminated layers of the conducting layers 102. In view of this, the structure of this first embodiment allows decreasing the occupation areas of the stepped wiring portions CR1 and CR2, ensuring downsizing the semiconductor memory device.

The above-described example describes the case where the certain conducting layer 102 includes the contact formation area 102a only either one of the right and left stepped wiring portions CR1 and CR2. However, the embodiment should not be limited to the example illustrated in the drawing. For example, some of the conducting layers 102 among the plurality of conducting layers 102 can include the contact formation areas 102a both on the right and left stepped wiring portions CR1 and CR2.

[Manufacturing Method]

Next, with reference to FIG. 6 to FIG. 12, the following describes the manufacturing method for the semiconductor memory device according to the first embodiment in detail, especially the forming procedure of the stepped wiring portions CR1 and CR2. As described later in detail, with this embodiment, the laminated body of the conducting layers 102 and the interlayer insulating films 112 and 113 are formed as follows. First, the interlayer insulating films and the sacrificial layers are laminated in alternation and the sacrificial layers are removed. After that, the conducting layers 102 are embedded to the voids (air gaps) from which the sacrificial layers have been removed. From an aspect of reduction in its resistivity, the conducting layer 102 is preferably formed of a metal film such as tungsten as a material. However, it is not easy to form the memory hole MH, which penetrates the tungsten and silicon oxide films, at a high density. In view of this, as described below, the laminated body of the conducting layers 102 and the interlayer insulating films 112 and 113, which are formed of the metal films, is formed as follows. The interlayer insulating films and the sacrificial layers are laminated in alternation, and the sacrificial layers are removed. After that, the conducting layers 102 are embedded into the voids from which the sacrificial layers have been removed. The following describes the processes in detail with reference to FIG. 6 to FIG. 12.

Figure 6:
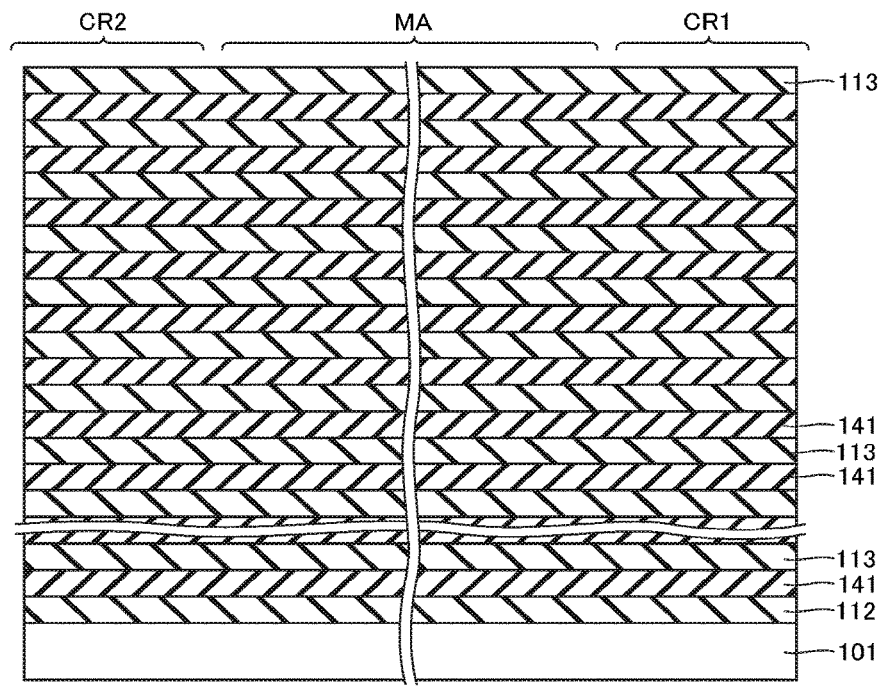
FIG. 6 to FIG. 12 are process diagrams illustrating a method for manufacturing the semiconductor memory device according to the first embodiment.

First, as illustrated in FIG. 6, the interlayer insulating films 112 and 113 are laminated sandwiching a sacrificial layer 141 between them on the semiconductor substrate 101. When forming the interlayer insulating films 112 and 113 with silicon oxide film, as a the material of the sacrificial layer 141, a material that features a high etching rate with respect to a silicon oxide film (for example, a silicon nitride film (SiN) or amorphous silicon) is selected.

Figure 7:
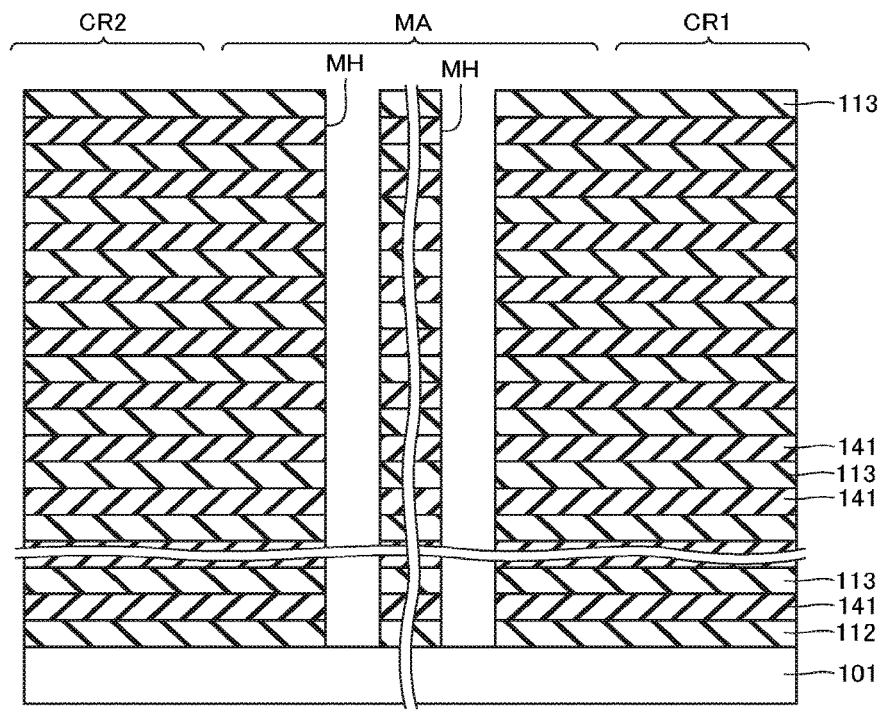

Then, as illustrated in FIG. 7, among the laminated body of the sacrificial layers 141 and the interlayer insulating films 112 and 113, at the parts where the memory cell arrays MA should be formed, the memory holes MH are formed using photolithography and etching techniques.

Figure 8:
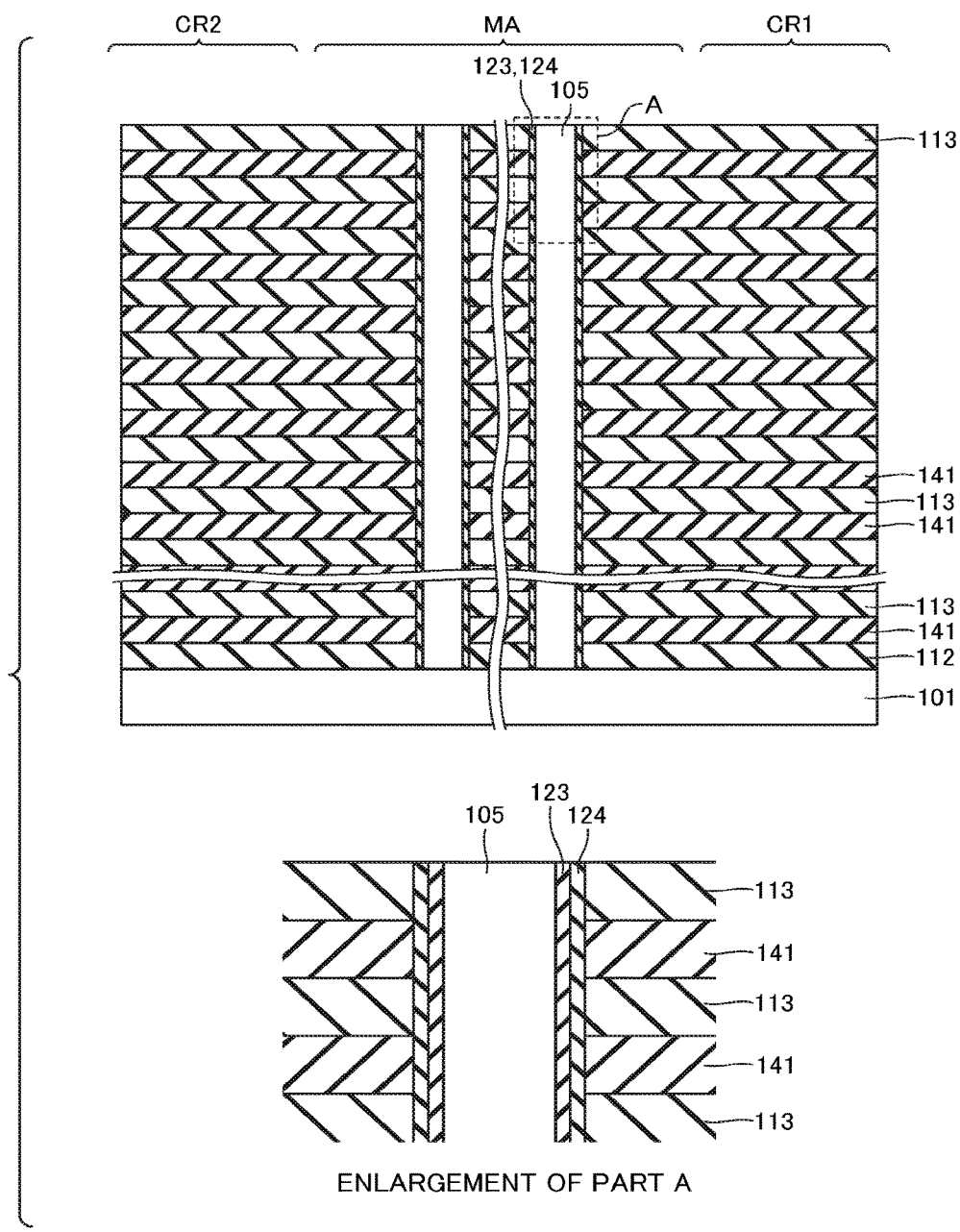

Further, as illustrated in FIG. 8, on the sidewall of this memory hole MH, the above-described electric charge accumulating layer 124 and tunnel insulating layer 123 are deposited in this order by a plasma CVD method or a similar method. Afterwards, the above-described memory columnar body 105 is formed so as to embed the inside of the memory hole MH, thus forming the memory unit MU. Although the illustration is omitted, the above-described support pillar 111 is also formed at this phase similar to the memory unit MU. The memory columnar body 105 is formed as follows. For example, amorphous silicon is deposited. After that, a predetermined thermal process crystallizes the amorphous silicon. This manufacturing process forms the memory unit MU and then forms the stepped wiring portion CR. However, opposite from this, it is also possible that the stepped wiring portion CR is formed and then the memory unit MU is formed.

Figure 9:
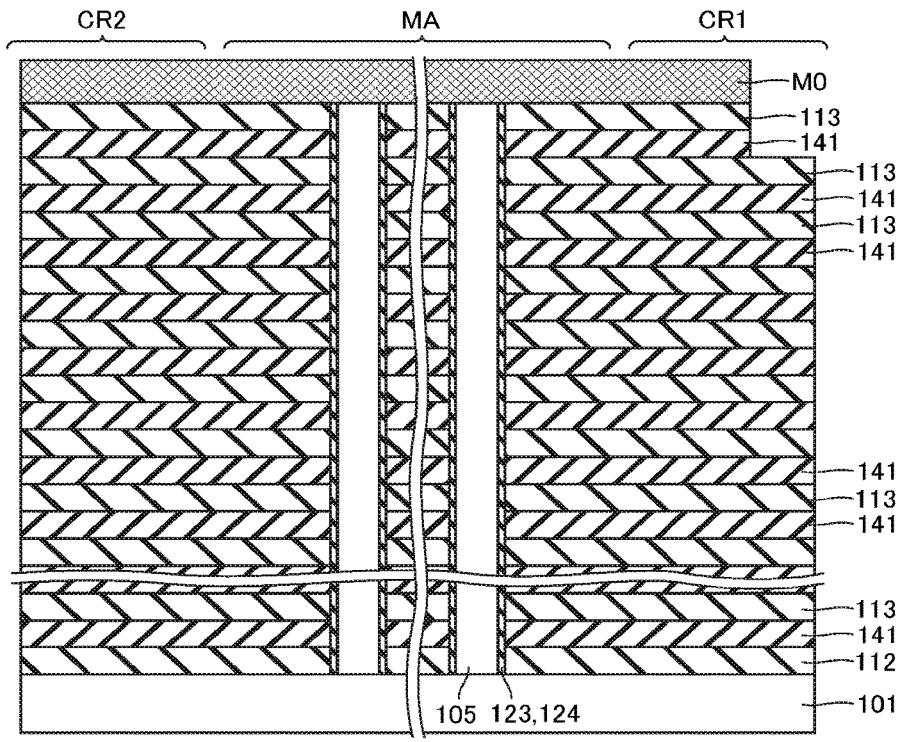

Then, as illustrated in FIG. 9, a mask M0 is deposited on the surface of the interlayer insulating film 113 on the uppermost layer. In FIG. 9, the (one) interlayer insulating film 113 on the uppermost layer at the part corresponding to the stepped wiring portion CR1 and the sacrificial layer 141 one immediately below the interlayer insulating film 113 are removed by reactive ion etching (RIE).

Figure 10:
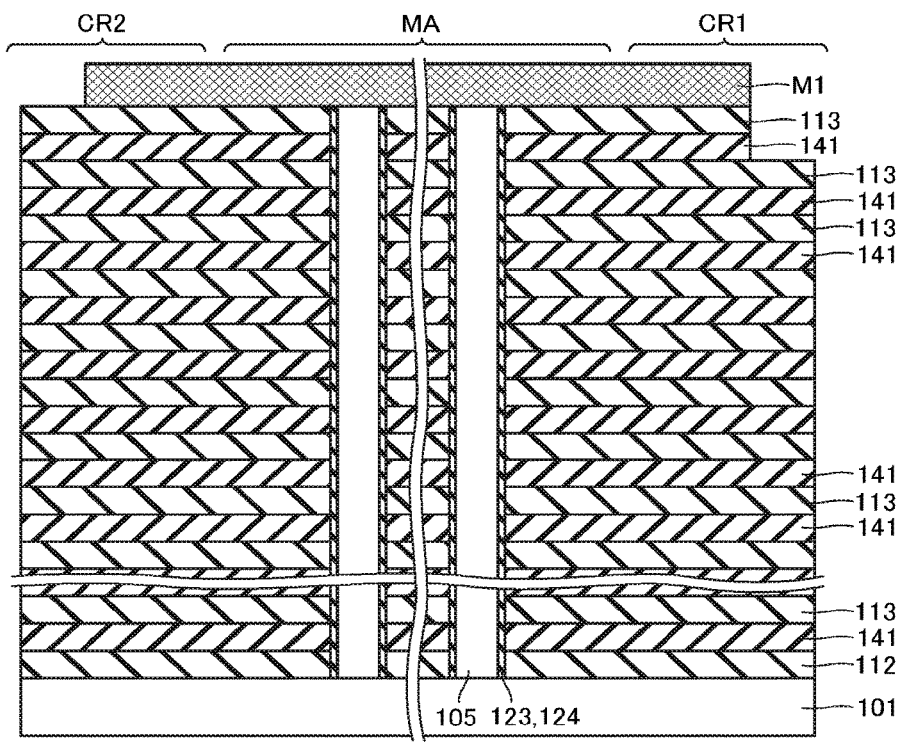

Thereafter, as illustrated in FIG. 10, a resist M1 is additionally formed on the surface of the interlayer insulating film 113 on the uppermost layer. In the stepped wiring portion CR1, this resist M1 is formed such that the end portion of the resist M1 approximately matches the end portion of the interlayer insulating film 113 on the uppermost layer. Meanwhile, in the stepped wiring portion CR2, the end portion is formed so as to be slightly shifted backward of the end portion of the interlayer insulating film 113 on the uppermost layer.

Figure 11:
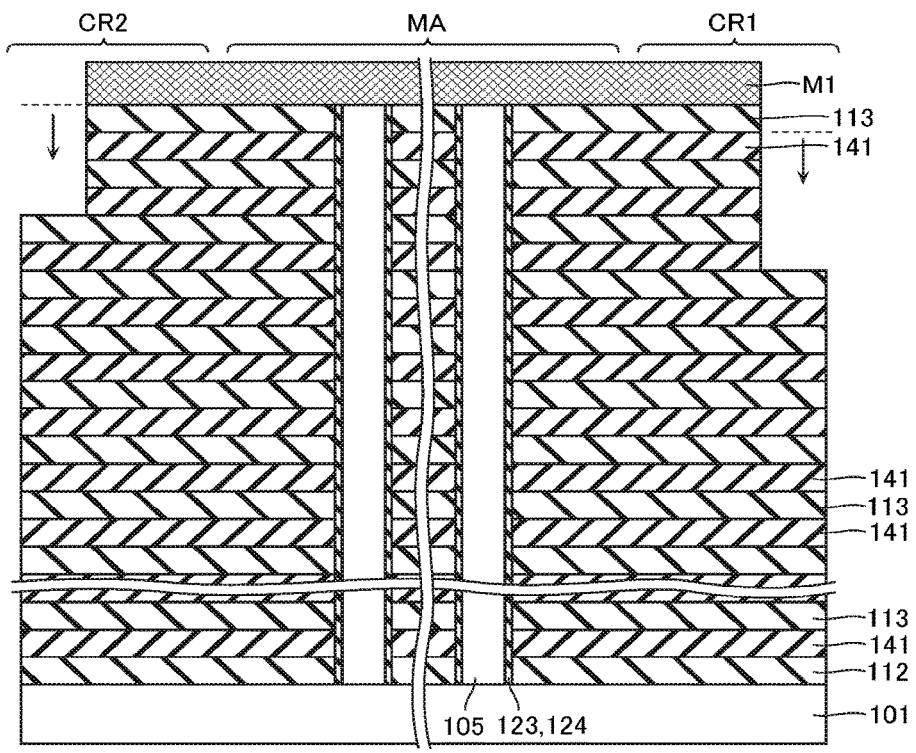

In a state where the resist M1 as illustrated in FIG. 10 is formed, as illustrated in FIG. 11, the reactive ion etching (RIE) is performed using the resist M1 as a mask to remove the respective two layers of the interlayer insulating films 113 and the two layers of the sacrificial layers 141 in the stepped wiring portions CR1 and CR2 by etching (the arrow indicates the direction of etching). By the process illustrated in FIG. 9, the height of the stepped portion of the stepped wiring portion CR1 is lower than the stepped portion of the stepped wiring portion CR2 by the amount of the one interlayer insulating film 113 and the one sacrificial layer 141.

Figure 12:
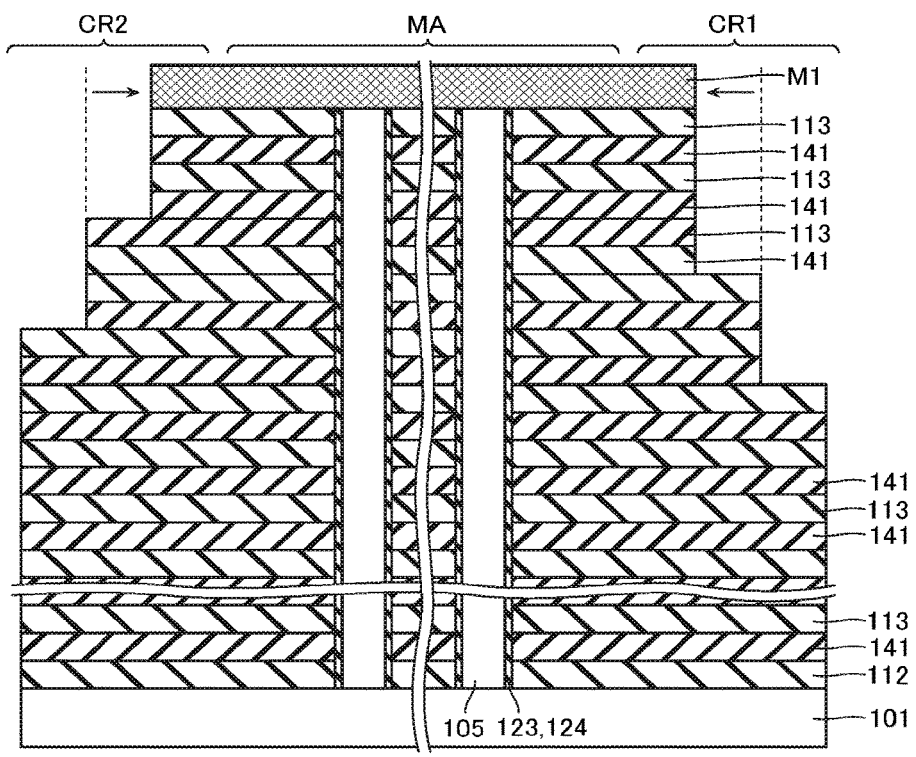

After that, as illustrated in FIG. 12, the slimming process is gradually performed on the resist M1. After that, the sacrificial layer 141 and the interlayer insulating film 113 are further etched by the reactive ion etching. After removing the respective two layers of the interlayer insulating films 113 and the two layers of the sacrificial layers 141 from the stepped wiring portions CR1 and CR2 by etching, the slimming process is performed on the resist again to shift the resist backward to the memory cell array MA side. Repeating these processes forms the stepped wiring portions CR1 and CR2. That is, in the stepped wiring portion CR1, the contact formation areas 102a are formed only on the even-th conducting layers 102 counted from the above. In the stepped wiring portion CR2, the contact formation areas 102a are formed only on the odd-th conducting layers counted from the above.

Although not illustrated hereinafter, wet etching using a hot phosphoric acid solution is performed via a slit formed on a position (not illustrated). This removes the sacrificial layer 141. After removing the sacrificial layer 141, the air gap is formed. After that, the block insulating layer 125 is formed on the wall surface of this air gap up to a predetermined film thickness using the CVD method or a similar method. After that, metal such as tungsten is embedded into the remaining air gap. This completes the laminated structure illustrated in FIG. 5.

The above-described example describes the method that laminates the sacrificial layer 141 first, removes the sacrificial layer 141 by etching, and then embeds the conducting layer 102 into the remaining void. However, the device of this embodiment is not limited to this manufacturing method. As long as the material of the conducting layer 102 is a material with which the memory holes MH can be formed at a high density, it is also possible that the sacrificial layers 141 are not laminated but the conducting layers 102 and the interlayer insulating films are laminated in alternation from the phase of FIG. 6.

[Modification of First Embodiment]

The following describes modifications of the first embodiment with reference to FIG. 13 to FIG. 18.

Figure 13:
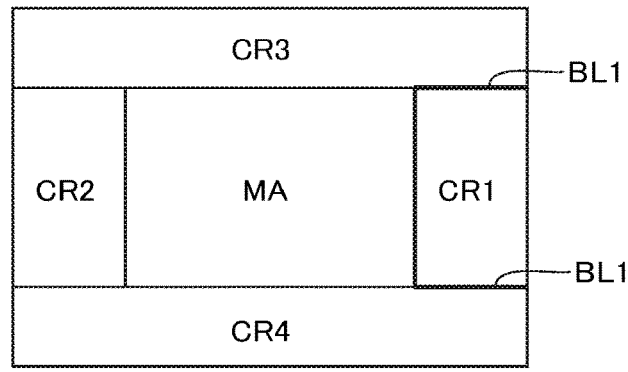
FIG. 13 to FIG. 18 illustrate first to third modifications of the semiconductor memory device according to the first embodiment.

FIG. 13 is a planar layout diagram of a semiconductor memory device according to a first modification. This first modification includes stepped wiring portions CR3 and CR4 on the side surfaces of the memory cell array MA in the Y direction, in addition to the stepped wiring portions CR1 and CR2 on the side surfaces in the X direction. Thus, the stepped wiring portion is disposed across the whole circumference of the memory cell array MA. This stepped wiring portions CR3 and CR4 are dummy wiring portions not used as wirings. However, performing the slimming process on the resist to form the stepped wiring portions CR1 and CR2 forms the stepped wiring portions CR3 and CR4 simultaneous with the stepped wiring portions CR1 and CR2.

In the stepped wiring portions CR3 and CR4 of this first modification, the entire stepped portions are formed at the height identical to the stepped wiring portion CR2. In other words, the stepped wiring portions CR2, CR3, and CR4 do not generate a level difference in the circumferential direction.

Figure 14:
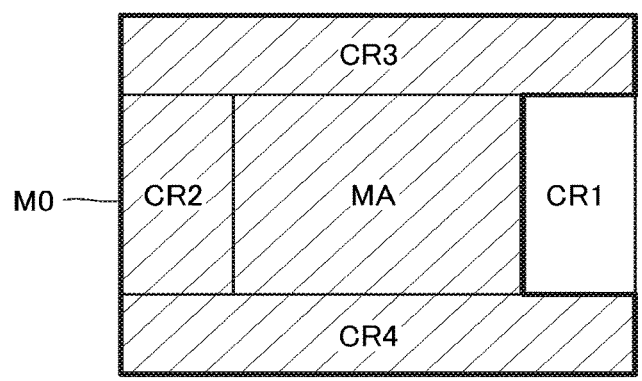

Meanwhile, the stepped wiring portion CR1 and the stepped wiring portion CR3 or CR4 generate a level difference in the circumferential direction. The level difference is present, for example, at a boundary BL1 between the stepped wiring portions CR1 and CR3 or the stepped wiring portions CR1 and CR4. As illustrated in FIG. 14, a mask M0, which is described in FIG. 9, is deposited setting the boundary BL1 as the end portion so as to expose only the stepped wiring portion CR1. This allows forming such level difference.

Figure 15:
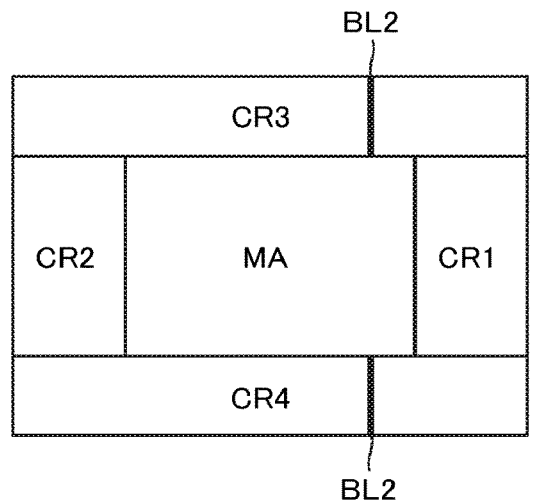
Figure 16:
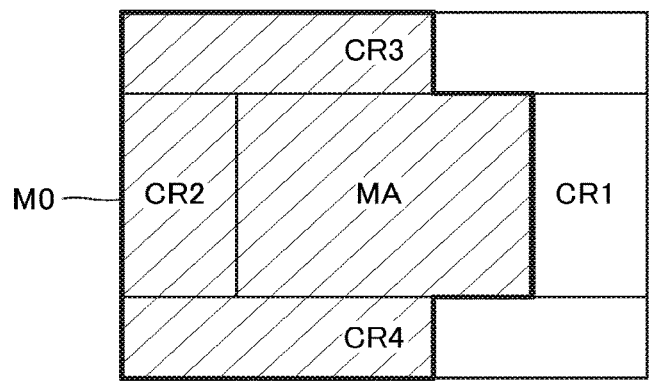

FIG. 15 is a planar layout diagram of a semiconductor memory device according to a second modification. In this second modification, a boundary BL2 of the level difference of the stepped portions is present in areas in the stepped wiring portions CR3 and CR4. These stepped wiring portions CR3 and CR4 of this second modification have a stepped shape identical to the stepped wiring portion CR2 on the side close to the stepped wiring portion CR2 more than the boundary BL2. The stepped wiring portions CR3 and CR4 have the stepped shape identical to the stepped wiring portion CR1 on the side close to the stepped wiring portion CR1 more than the boundary BL2. This shape can be formed as follows. As illustrated in FIG. 16, the mask M0 is deposited setting the boundary BL2 as the end portion, thus forming the level difference.

Figure 17:
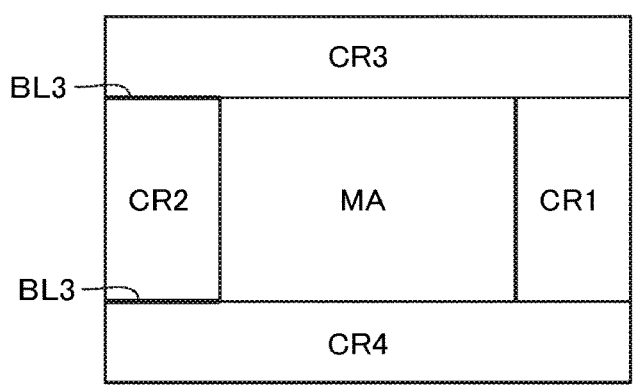
Figure 18:
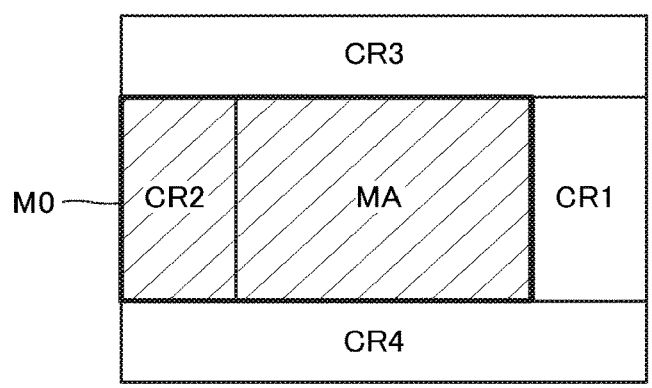

FIG. 17 is a planar layout diagram of a semiconductor memory device according to a third modification. In this third modification, a boundary BL3 of the level difference of the stepped portion is present at a boundary between the stepped wiring portion CR3 and the stepped wiring portion CR2. As illustrated in FIG. 18, setting the boundary BL3 as the end portion, the mask M0 is deposited so as to cover only the stepped wiring portion CR2 and the memory cell array MA, ensuring forming such level difference.

As described above, the first to the third modifications include the stepped wiring portion across the whole circumference of the memory cell array MA. The stepped wiring portion CR can be shaped so as to have the level difference in the circumferential direction at any of the positions. It is only necessary that the mask M0 at least covers the areas where the stepped wiring portion CR2 and the memory cell array MA are formed and has an end portion at any of the positions in the stepped wiring portion.

[Second Embodiment]

Figure 19:
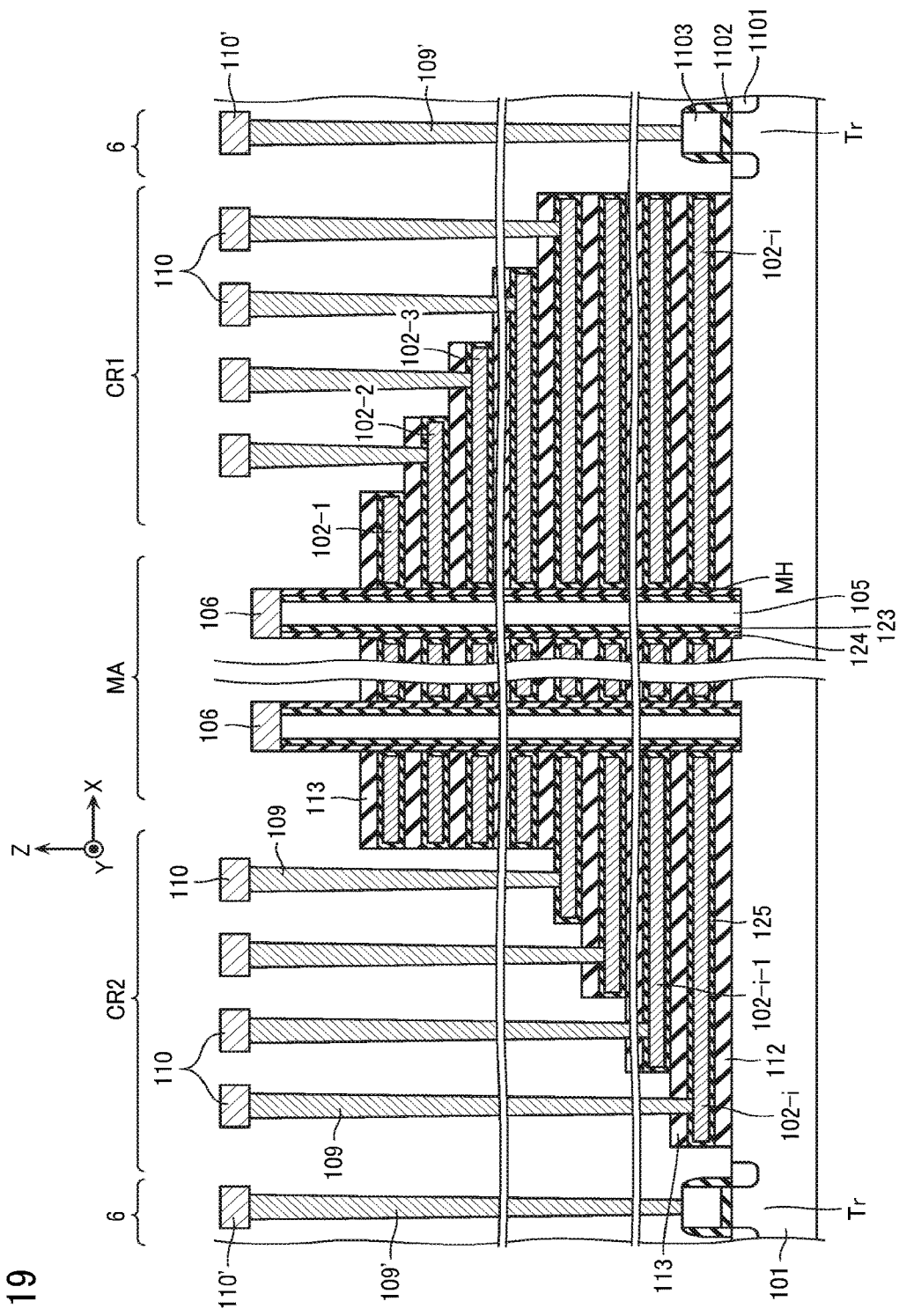
FIG. 19 is a cross-sectional view of the semiconductor memory device according to the second embodiment along the X direction.

Next, the following describes a semiconductor memory device according to the second embodiment with reference to FIG. 19. The overall structure of the semiconductor memory device of this second embodiment is identical to the first embodiment (FIG. 1). The structure of the memory cell array MA is also identical to the first embodiment. However, the semiconductor memory device of the second embodiment differs from the first embodiment in the structures of the stepped wiring portions CR1 and CR2.

FIG. 19 is a cross-sectional view of the semiconductor memory device according to the second embodiment along the X direction. FIG. 19 corresponds to FIG. 5 according to the first embodiment. In FIG. 19, like reference numerals designate elements corresponding or identical to the elements in FIG. 5, and therefore such elements will not be further elaborated here.

In the semiconductor memory device of this second embodiment, as illustrated in FIG. 19, in the stepped wiring portion CR1, the conducting layers 102 (the first group) disposed upward of the predetermined position include the contact formation areas 102a on the end portions among the plurality of conducting layers 102. The conducting layers 102 on the layers lower than the predetermined position (the second group) do not include the contact formation areas 102a. That is, the conducting layers 102 in the second group have aligned end portions. The surface of the certain conducting layer 102 is covered with the other conducting layer 102 on the upper layer of the certain conducting layer 102.

Meanwhile, in the stepped wiring portion CR2, the conducting layers 102 disposed downward of the predetermined position include the contact formation areas 102a on the end portions among the plurality of conducting layers 102. The conducting layers 102 on the layers upper than the predetermined position do not include the contact formation areas 102a. This point differs from the stepped wiring portions CR1 and CR2 of the first embodiment, which include the contact formation areas 102a on the even-th layers and the odd-th layers, respectively. This structure also allows decreasing the occupation areas of the stepped wiring portions CR1 and CR2.

[Manufacturing Method]

Subsequently, with reference to FIG. 20 to FIG. 22, the following describes a method for manufacturing the semiconductor memory device according to the second embodiment. The processes up to the formation of the memory unit MU are identical to the first embodiment; therefore, the following describes a method for forming the stepped wiring portions CR1 and CR2.

Figure 20:
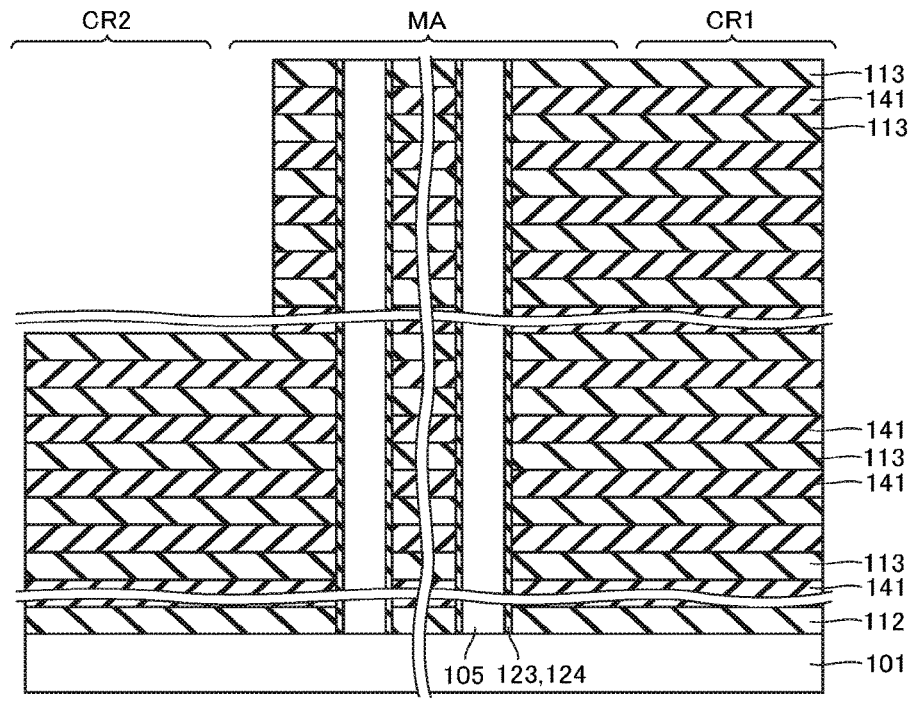
FIG. 20 to FIG. 22 are process diagrams illustrating a method for manufacturing the semiconductor memory device according to the second embodiment.

As illustrated in FIG. 20, after forming the memory unit MU in the memory cell array MA, the plurality of interlayer insulating films 112 and 113 and the plurality of sacrificial layers 141 positioned upward of the predetermined position on the stepped wiring portion CR2 side (in the example illustrated in the drawing, among all the interlayer insulating films 112 and 113 and the sacrificial layers 141, the approximately half number of the interlayer insulating films 113 and the sacrificial layers 141 on the upper layers more than the layer near the middle) are removed by etching.

Figure 21:
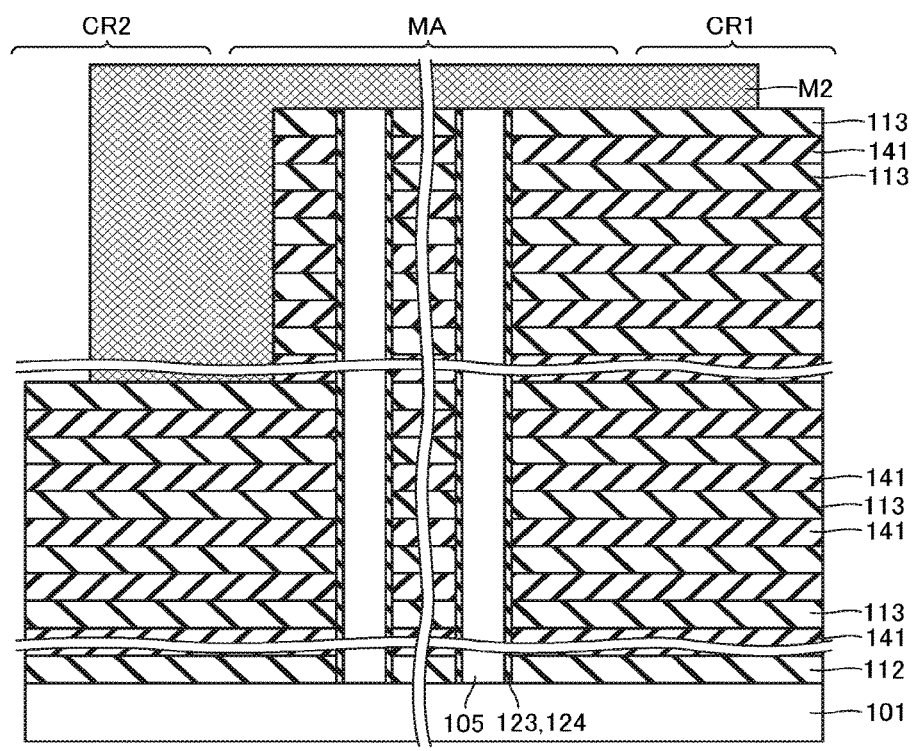
Figure 22:
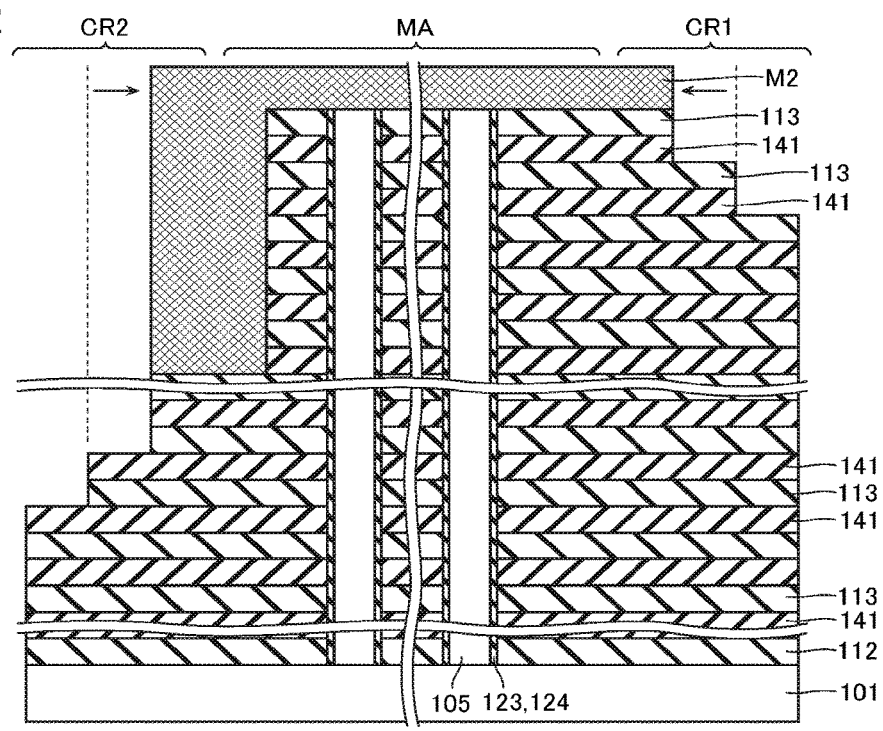

Next, as illustrated in FIG. 21, a resist M2 is formed on the entire surface excluding the end portions of the stepped wiring portions CR1 and CR2. In this state, the one interlayer insulating film 113 and the one sacrificial layer 141 are removed by etching. Thereafter, as indicated by the arrow in FIG. 22, after performing the slimming process on the resist M2, the one interlayer insulating film 113 and the one sacrificial layer 141 are removed again by the reactive ion etching using the resist M2 as the mask. By thus alternately repeating the slimming process and the etching, the stepped shapes of the stepped wiring portions CR1 and CR2 are completed. Thereafter, similar to the manufacturing method of the first embodiment, the sacrificial layer 141 is removed and the conductive layers 102 is formed, thus completing the structure illustrated in FIG. 13.

Similar to the modification of the first embodiment, this second embodiment also allows forming the stepped wiring portions CR3 and CR4 positioned on the side surfaces of the memory cell array MA in the Y direction. This also allows appropriately setting the boundary of the level difference similar to the modification of the first embodiment.

Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

Figure 23:
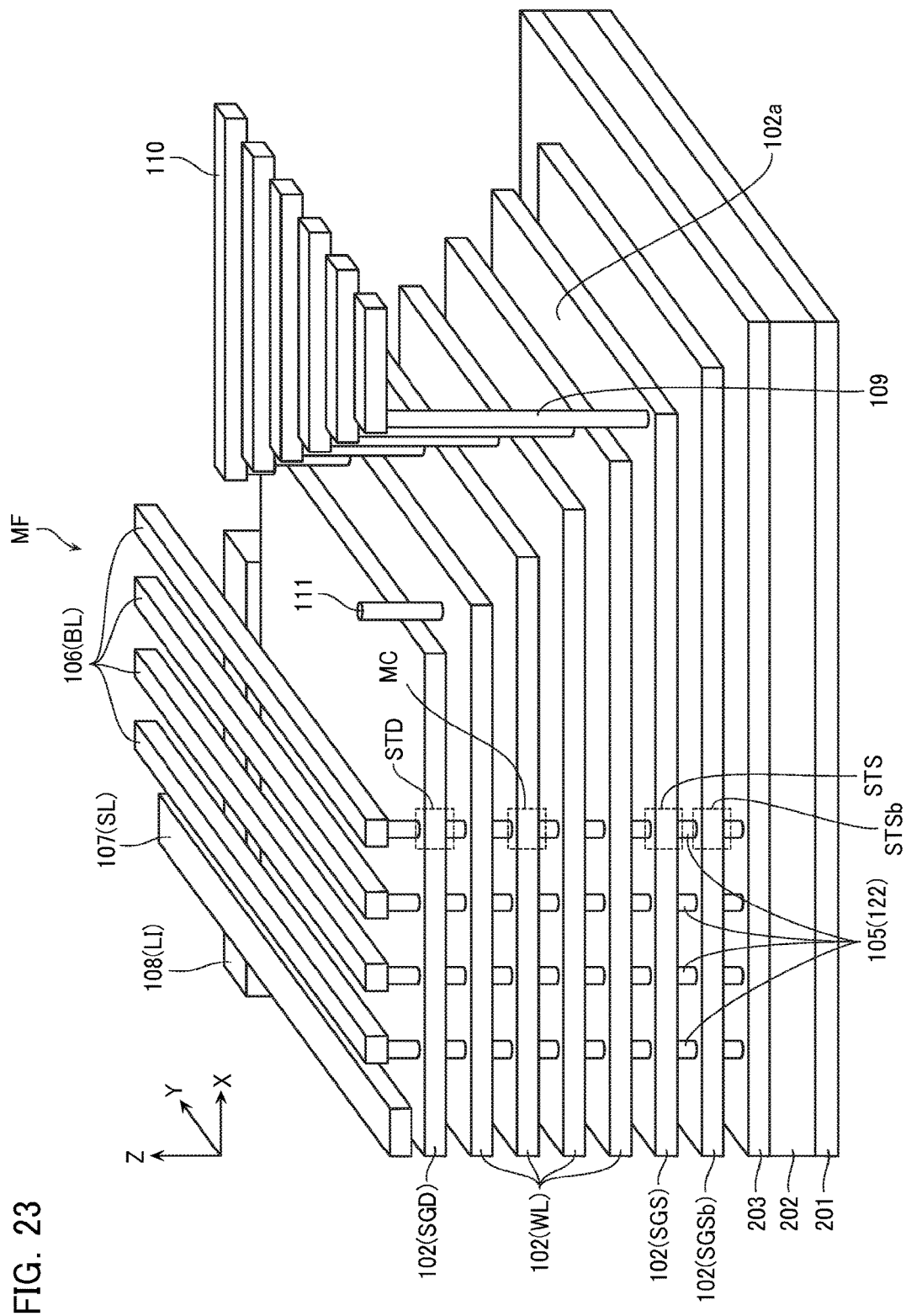
FIG. 23 and FIG. 24 illustrate modifications of the above-described embodiments.

FIG. 23 illustrates one modification of the above-described embodiments. In FIG. 23, like reference numerals designate elements corresponding or identical to the elements in FIG. 2, and therefore such elements will not be further elaborated here. In this modification, a circuit layer 202 is disposed on a substrate 201, and a conducting layer 203 is further disposed on the circuit layer 202. The circuit layer 202, for example, includes a transistor and a wiring layer. The conducting layer 203 is constituted of a semiconductor layer such as polysilicon and a metal layer such as tungsten. The conducting layer 203 is connected to the lower ends of the memory columnar bodies 105.

Figure 24:
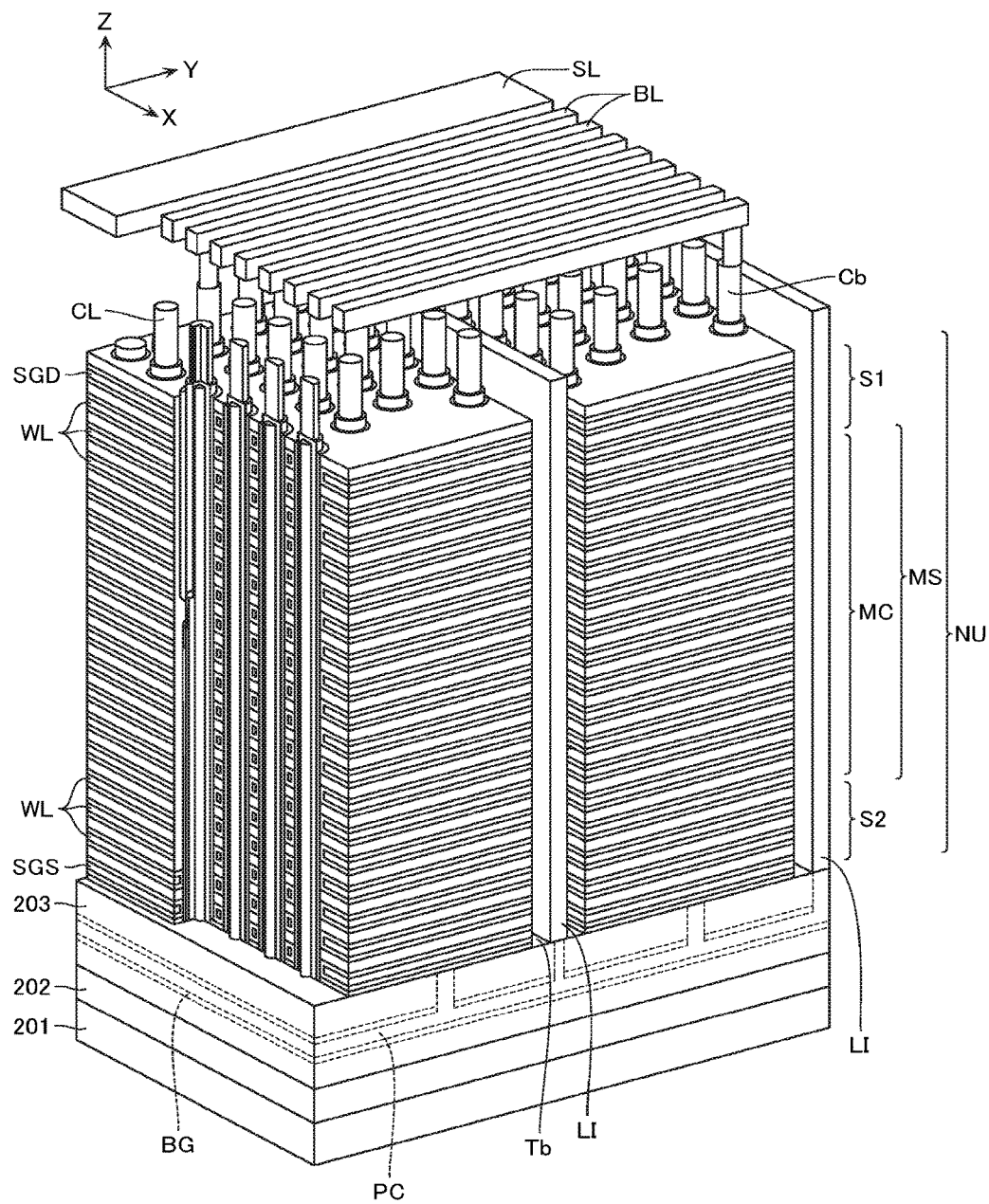

FIG. 24 illustrates another modification of the above-described embodiments. This embodiment includes a back gate line BG and a wiring layer PC inside the semiconductor substrate 203. The wiring layer PC connects the lower ends of the plurality of memory columnar bodies 105 and the lower end of the source contact LI. The back gate line BG is formed on the peripheral area of the wiring layer PC via a gate insulating film (not illustrated). Applying a gate voltage to the back gate line BG forms a channel in the wiring layer PC, ensuring conduction of the wiring layer PC.

What is claimed is:

1. A semiconductor memory device, comprising:
   a memory cell array that includes a plurality of memory cells and a plurality of first conducting layers, the memory cells being arrayed in a three-dimensional manner, the first conducting layers being connected to the memory cells and being arrayed in a laminating direction;
   a first stepped wiring portion disposed on a first side portion of the memory cell array;
   a second stepped wiring portion disposed on a second side portion of the memory cell array, the second side portion being opposite from the first side portion across the memory cell array in a first direction when viewed in the laminating direction;
   a third stepped wiring portion disposed on a third side portion of the memory cell array; and
   a fourth stepped wiring portion disposed on a fourth side portion of the memory cell array, the fourth side portion being opposite from the third side portion across the memory cell array in a second direction when viewed in the laminating direction, the second direction intersecting the first direction,
   wherein:
   the first stepped wiring portion to the fourth stepped wiring portion include a plurality of second conducting layers that are connected to the plurality of first conducting layers;
   at least one of the plurality of second conducting layers includes a contact formation area on a top surface thereof in the first stepped wiring portion;
   other ones of the plurality of second conducting layers include a contact formation area on a top surface thereof in the second stepped wiring portion;
   levels of the plurality of second conducting layers in the third stepped wiring portion are the same with levels of the plurality of the second conducting layers in the first stepped wiring portion in the laminating direction, or levels of the plurality of second conducting layers in the third stepped wiring portion are the same with levels of the plurality of the second conducting layers in the second stepped wiring portion in the laminating direction; and
   levels of the plurality of second conducting layers in the fourth stepped wiring portion are the same with the levels of the plurality of the second conducting layers in the first stepped wiring portion in the laminating direction, or levels of the plurality of second conducting layers in the fourth stepped wiring portion are the same with the levels of the plurality of the second conducting layers in the second stepped wiring portion in the laminating direction.

2. The semiconductor memory device according to claim 1, wherein:
   the first stepped wiring portion includes the contact formation area on the even-th second conducting layers counted from an upper layer side and the second stepper wiring portion includes the contact formation area on the odd-th second conducting layers counted from the upper layer side.

3. The semiconductor memory device according to claim 1, wherein:
the first stepped wiring portion includes the contact formation area on the second conducting layer positioned downward of a predetermined position in the laminating direction; and
the second stepped wiring portion includes the contact formation area on the second conducting layer positioned upward of the predetermined position.

4. The semiconductor memory device according to claim 1, wherein:
in the first stepped wiring portion, at least the one second conducting layer is covered with the second conducting layer positioned on an upper layer side thereof; and
in the second stepped wiring portion, at least the one second conducting layer is covered with the second conducting layer positioned on an upper layer side thereof.

5. The semiconductor memory device according to claim 4, wherein:
the first stepped wiring portion includes the contact formation area on the even-th second conducting layers counted from an upper layer side; and
the second stepper wiring portion includes the contact formation area on the odd-th second conducting layers counted from the upper layer side.

6. The semiconductor memory device according to claim 4, wherein:
the first stepped wiring portion includes the contact formation area on the second conducting layer positioned downward of a predetermined position in the laminating direction; and
the second stepper wiring portion includes the contact formation area on the second conducting layer positioned upward of the predetermined position.

7. The semiconductor memory device according to claim 1, further comprising:
a first row decoder connected to the memory cell array via the first stepped wiring portion; and
a second row decoder connected to the memory cell array via the second stepped wiring portion.

8. The semiconductor memory device according to claim 7, wherein:
the first stepped wiring portion includes the contact formation area on the even-th second conducting layers counted from an upper layer side; and
the second stepper wiring portion includes the contact formation area on the odd-th second conducting layers counted from the upper layer side.

9. The semiconductor memory device according to claim 7, wherein:
the first stepped wiring portion includes the contact formation area on the second conducting layer positioned downward of a predetermined position in the laminating direction; and
the second stepper wiring portion includes the contact formation area on the second conducting layer positioned upward of the predetermined position.

10. The semiconductor memory device according to claim 1, wherein the first stepped wiring portion to the fourth stepped wiring portion are formed so as to surround the memory cell array across a whole circumference.

11. The semiconductor memory device according to claim 10, wherein:
the plurality of second conducting layers in the third stepped wiring portion are continuous with the plurality of the second conducting layers in the first stepped wiring portion, or the plurality of second conducting layers in the third stepped wiring portion are continuous with the plurality of the second conducting layers in the second stepped wiring portion; and
the plurality of second conducting layers in the fourth stepped wiring portion are continuous with the plurality of the second conducting layers in the first stepped wiring portion, or the plurality of second conducting layers in the fourth stepped wiring portion are continuous with the plurality of the second conducting layers in the second stepped wiring portion.

12. The semiconductor memory device according to claim 1, wherein each of the first stepped wiring portion to the fourth stepped wiring portion is stepped downward as it goes away from the memory cell array.

* * * * *